United States Patent [19]
Pritchard

[11] Patent Number: 5,761,316
[45] Date of Patent: Jun. 2, 1998

[54] VARIABLE AND REACTIVE AUDIO POWER AMPLIFIER

[76] Inventor: Eric K. Pritchard, Rte. 1 Box 536, Berkeley Springs, W. Va. 25411

[21] Appl. No.: 607,450

[22] Filed: Feb. 27, 1996

[51] Int. Cl.⁶ .................................................. H03G 3/00
[52] U.S. Cl. .............. 381/61; 330/102; 381/96; 381/108
[58] Field of Search ................... 381/61, 96; 330/102, 330/293

[56] References Cited

U.S. PATENT DOCUMENTS

| | | | |
|---|---|---|---|
| 3,972,002 | 7/1976 | Aprille, Jr. | 330/102 |
| 4,150,253 | 4/1979 | Knoppel. | |
| 4,180,707 | 12/1979 | Moog. | |
| 4,286,492 | 9/1981 | Claret. | |
| 4,393,353 | 7/1983 | Minagawa | 330/102 |
| 4,627,094 | 12/1986 | Scholz. | |
| 4,644,289 | 2/1987 | Kennedy et al. | |
| 4,731,852 | 3/1988 | Liljeryd. | |
| 4,811,401 | 3/1989 | Brown, Sr. et al. | 381/61 |
| 5,086,473 | 2/1992 | Erath | 381/96 |
| 5,197,102 | 3/1993 | Sondermeyer | 381/96 |
| 5,245,296 | 9/1993 | Miller et al. | 330/102 |
| 5,487,114 | 1/1996 | Dinh. | |
| 5,636,284 | 6/1997 | Pritchard | 381/61 |

OTHER PUBLICATIONS

"Marshall Master Volume"., Ken Fisher, The Tube Amp Book, p. 286, 4th Edition, Apsen Pittman, 1993, Groove Tubes.

Radiotron Designer's Handbook, pp. 1322–1323, edited by F. Langford–Smith, 1953, RCA Victor Division, Radio Corporation of America.

SPICE for Circuits and Electronics Using PSpice by Muhammad H. Rashid, 1990, pp. V–XV.

*Primary Examiner*—Forester W. Isen
*Attorney, Agent, or Firm*—Barnes & Thornburg

[57] ABSTRACT

This disclosure shows the solid state emulation of elements of a thermionic emission device amplifier which distinguish it from solid state amplifiers: the output impedance of transformer impedance with plate resistance, the transfer function coupling from the driver tube to the output tubes, the non-linearity of the output tubes, the compression created by the power supply droop, the inclusion of "fat" from the power supply, bias shifting of the input, and driving the input from a non-linear network. This disclosure also depicts advantageous features not found in tube amplifiers: a means for turning it down and maintaining the tone by maintaining the interrelationships within the amplifier and fat creation from the amplifier output and from external sources. This disclosure is based upon the novel use of controlled gain and controlled impedance means.

66 Claims, 4 Drawing Sheets

5,761,316

VARIABLE AND REACTIVE AUDIO POWER AMPLIFIER

BACKGROUND OF THE INVENTION

This invention relates to the emulation of vacuum tube amplifiers using the tube emulation technology. This technology emulates the operation of vacuum tubes or thermionic emission devices and their circuits by solid state circuits. This invention also relates to the use of controllable gain amplifiers and controllable impedance devices in audio applications including the production of "fat" tones in amplifiers, speakers, and guitar pickups and including the control of the output power in amplifiers in a manner that does not alter the tone and the relationship between distorted and undistorted signals.

This invention also relates to the emulation of vacuum tube preamplifiers and the creation of audio effects by digital computer in an embodiment that intertwines the advantages of digital control with the capabilities of the analog output stage.

The simplest approach to variable amplifier power is simply the volume control, or as it is better known in the guitar amplifier arts, the master volume control. This simple potentiometer reduces the amplifier power by merely reducing the signal to the output stage. This action changes the tone by removing the distortion of the output stage. To compensate, amplifier designers put in substantial preamplifier gain and distortion. Unfortunately, preamplifier distortion is quite inferior to output stage distortion. Consequently, there have been a variety of efforts to provide output stage distortion at variable powers.

Claret, U.S. Pat. No. 4,286,492, reduced the screen voltage of vacuum pentodes to reduce the output current and thereby reduce the output power. While the methods introduced by Claret do reduce the output power, they change the character of the amplifier by not altering the clipping created by the saturation of the output tubes. Since this clipping occurs at bass and treble frequencies where the speaker impedance is markedly higher than nominal, the reduced power tone is different than the normal power tone.

A more complete system is to reduce the voltage to the vacuum tubes thereby reducing both the screen voltage and the plate voltage. However, this technique, Smith U.S. Pat. No. 5,091,700, has a limited range. The Variac predecessor could have a wider range if the filaments were operated at a constant voltage and is quite expensive.

Production amplifiers use a variety of switching techniques to change power supply voltages or to switch from pentode to triode operation to reduce the power. Switching from pentode to triode operation changes the tone by seriously altering, substantially lowering, the plate resistance.

This disclosure is also similar to my first tube emulation patent, U.S. Pat. No. 4,809,336 in that it incorporates a filter and non-linear elements inside a feedback loop. The operation of this circuit narrowed the frequency response, i.e. reduced the treble roll-off frequency when driven excessively. The filter of this disclosure has an insignificant output impedance, not suited for driving a speaker.

The digital emulation of vacuum tubes is easier and faster if there is no feedback loop in the vacuum tube circuit. Since the tube circuit is both non-linear and time dependant, the software must emulate the non-linearities and the time dependencies in the same order that they occur in the vacuum tube circuit. Feedback changes the input once a new output is calculated and thereby requires subsequent calculations to find the proper output value. These subsequent calculations require more time of a very busy processor. Removing any reason for a feedback from digital emulation is an important feature of the variable power output stage.

The digital emulation of audio is the subject of my earlier applications, now U.S. Pat. Nos. 4,995,084, 5,133,014, and 5,434,536 and various foreign applications and included herein by reference.

The concept of a speaker using an electro-magnet is not new. Decades ago, this inductor was used to filter the amplifier power supply as well as produce the magnetic field for the voice coil. However, it has never been the intent to produce a "fat" tone or a sound that contained modulation with the A.C. component of the current in the speaker.

The "fat" emulation ie. the modulation with a low frequency signal is derived from either the tube amplifier bias supply or the screen grid supply. The ripple modulates the power tube signal with a harmonically rich signal. This modulation broadens each spectral line of the signal and thereby making them "fat". Of course, this is the antithesis of engineering practice which precludes amplifiers or speakers from being part of the art and demands that the output signal be as precisely proportional to the input as possible. Not only is the concept of fat previously unknown, the engineering concepts imbedded in intermodulation distortion tests advocate the elimination of any modulation product.

OBJECTS OF THE INVENTION

Figure 1:
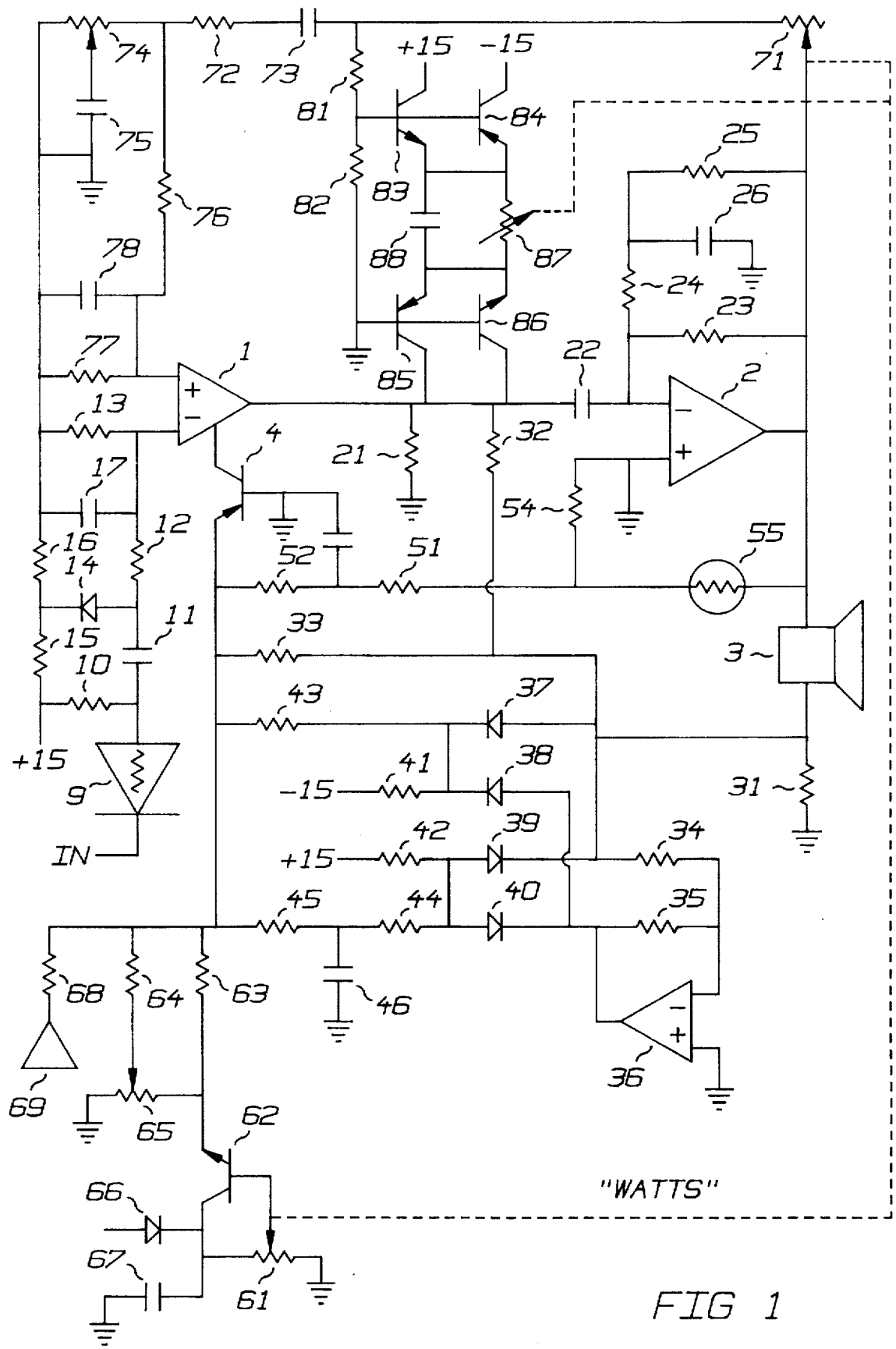
FIG. 1 is a schematic of a variable power amplifier based upon a variable gain operational transconductance amplifier.

An object of this invention is the control of the output power of vacuum tube emulating solid state amplifier while maintaining transfer functions and character.

An object of this invention is the amplifier structures which control output power while maintaining transfer functions and character like that of vacuum tube amplifiers or amplifiers that use thermionic emission devices.

Another object of this invention is creation of fat by filtering signals from the output, creation of fat from power supply ripple, or from some other source.

Another object of this invention is the digital control of the variable power output stage and the combination of digital preamplifier emulation and digital effects execution with said variable power output stage.

An object of this invention is the generalized use of the variable gain concepts in speakers and guitar pickups.

DESCRIPTION OF THE FIRST EMBODIMENT

This invention is based upon a variable gain transconductance amplifier 1, a power amplifier 2, transfer function components, a bias shifting input circuit, a variable attenuation feedback and clipping circuit, a variable bias circuit, a current feedback circuit, harmonic generation circuits, a compression circuit, "fat" or intermodulation circuits, and a speaker load 3.

Amplifier 1 is an operational transconductance amplifier such as the RCA/Harris CA 3080 or the National LM 3080. These devices have a stable, direct, linear relationship between the bias or gain control signal and its transconductance or gain. Amplifier 2 is a audio power integrated circuit such as the National LM 3886.

The input comes from a non-linear means 9 and a "plate load" resistor 10 and has an audio spectrum with spectral lines or frequency components. The non-linear means 9 is shown as a special symbol for any of the FIGS. 3, 4, or 5 which are described below. This non-linear means produces both even and odd harmonics without clipping and produces the tube type "soft clipping" or cutoff emulation as the input voltage approaches the power supply, +15.

The input circuit begins with coupling capacitor 11 for receiving the input and continues with resistors 12 and 13 connected as a voltage divider for driving the input of transconductance amplifier 1. The bias shifter consists of the capacitor 11, diode 14, and resistors 15 and 16. These resistors are connected from a power supply, +15 for example, to ground to provide an open circuit voltage appropriate for bias shifting and an equivalent resistance that determines the amount of bias shift relative to the resistance of resistors 12 and 13. The appropriate open circuit voltage is approximately the voltage on resistors 12 and 13 when at clipping, i.e. when the output of amplifier 2 reaches a maximum or minimum. The equivalent resistance of resistors 15 and 16, i.e. their parallel resistance value, may be equal to the series resistance of resistors 12 and 13. A higher resistance will produce less bias shift; and a lower resistance, more. The bias shifter produces even harmonics in a basically symmetrical, odd-harmonic structure.

Capacitors 11 and 17 are the input portion of a filter that establishes the output stage frequency response.

The transconductance amplifier 1 drives amplifier 2 via the transfer and feedback function network. Resistor 21 shunts the output of amplifier 1 to ground while capacitor 22 transmits the output of amplifier 1 to the inverting input of amplifier 2. The network continues with the feedback network of resistors 23, 24, and 25 and shunt capacitor 26 and correspond to the low frequency roll-off frequency of the output transformer.

The current in the speaker 3 is sensed by resistor 31. This resistor also does double duty by emulating, or helping the emulation of, the saturation resistance of the tube amplifier output stage as seen through the output transformer. This resistor should be approximately one-eighth the nominal impedance of the load minus the saturation resistance of amplifier 2. The voltage across resistor 31 is conducted four places. Resistor 32 creates a current feedback which raises the output impedance of amplifier 2 to the approximate level of the plate resistance of a pentode as seen through an output transformer.

Since the speaker 3 connects the output to resistor 31, the consequential signals are responsive to the output.

The transformer and output tube non-saturated plate resistance has three types of impedances, inductive at low frequencies, resistive at middle frequencies, and capacitive at high frequencies. Resistors 21 and 32 combined with the gain-bandwidth product of amplifier 2 provides the high frequency capacitive impedance. The resistors 32 and 23 combine to provide the middle frequency resistive impedance. The resistors 21, 32, 24, and 25 and capacitors 22 and 26 form the low frequency inductive impedance. Preferably, the time constant of resistors 21 and 32 and capacitor 22 is equal to the time constant of resistors 24 and 25 and capacitor 26.

The target impedances can be readily measured by removing the driver tube of a tube amplifier, turning the amplifier on, and measuring the output impedances at various frequencies. For an 8 ohm nominal load the output impedances without feedback should be within an order of magnitude of 0.1 Hy at low frequencies, 50 ohms at middle frequencies, and 0.25 microfarad at high frequencies. This is substantially different than the minuscule impedances of typical solid state amplifiers.

Resistor 33 creates an inequality in the non-linear transconductance which creates even harmonics without clipping in a basically odd-harmonic structure. Resistor 34 drives the inverting amplifier consisting of resistor 35 and operational amplifier 36. The voltage on resistor 31 and the inverting amplifier 36 drives a diode network 37–40. The current in resistor 41 insures that at least one of the diodes 37 or 38 is conducting at all times and the current in resistor 42 insures that at least one of the diodes 39 or 40 is conducting at all times. Neglecting the diode voltage offset and the diode conduction characteristic, the outputs of the diode network are the absolute value and the negative of the absolute value of the load current. Resistor 42 gives the compressor circuit 44–46 a minimal threshold. Resistor 43 increases the bias and hence the gain of the transconductance amplifier 1 as the current in the load increases in magnitude. This is the approximate transfer characteristic of a pentode. Note further that this characteristic produces odd harmonics without clipping. The low-pass filter network made of resistors 44 and 45 and capacitor 46 emulates the response of a power supply under load of the output current. The current through resistor 45 reduces the bias and the gain of transconductance amplifier 1 to emulate the sag of the power supply voltage, the sag of the screen grid voltages and the consequential reduction in or the compression of the output. This compression is characterized by always being less than 10 db, having no or small threshold, having low gain, and by still allowing the output stage to go into clipping distortion.

The bias is also altered by the "fat" introduction circuit comprised of resistor 51 and 52 and capacitor 53. This network has a low-pass cutoff frequency of about 1000 radians per second thereby having a portion of the audio spectrum, a low-frequency portion. This network is driven by an optional but preferred compressor. It is preferred because otherwise the fat effect percentage rises with signal level and can go from unnoticeable to muddy. For this example, the compressor is made from a resistor 54 and a lamp 55. At low levels the lamp resistance is low and the attenuation through the network is low. At high levels the lamp resistance is higher and the attenuation through the network is higher. The fat circuit influence is a spice used to taste, and produces a maximum signal of 2 to 20 percent of the bias current. This circuit provides a second spectrum which amplifier 1 uses to broaden the spectral lines of the input spectrum.

Figure 8:
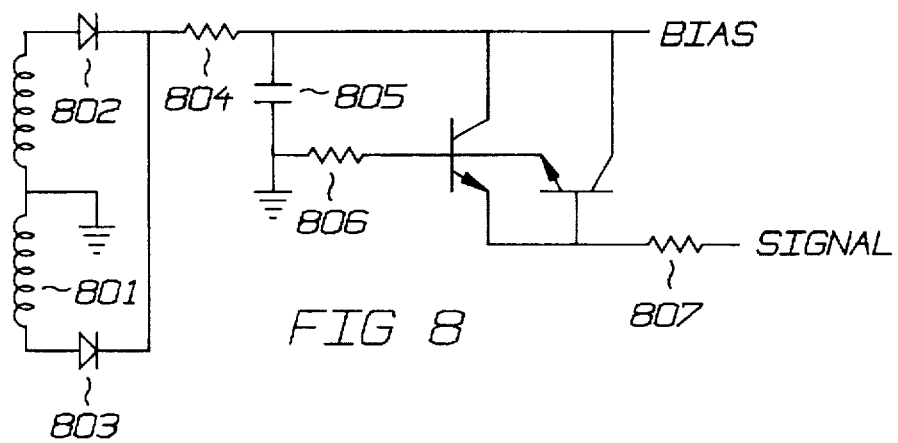
FIG. 8 is a schematic of a variable ripple supply.

The last biasing circuit provides the bias which is fixed by the "Power" or watts control potentiometer, i.e. power control means. This potentiometer is a tandem or dual potentiometer having sections 61 and 71, and optionally 87, operated by the same shaft and knob. The dot at one end indicates the clockwise or turned-up end of rotation. Potentiometer 61 is powered by an unregulated and barely filtered power supply made of a half-wave diode 66, also symbolic of a full wave rectifier, such as shown in FIG. 8, and capacitor 67 and produces a control signal on its wiper proportional to the desired output voltage swing. The output can be readily changed from one-sixth maximum to full maximum over the rotation of the potentiometer. Transistor 62 buffers the signal for bias setting resistors. Potentiometer 65 adjusts the amount of bias so that the transconductance amplifier 1 limits the input signal to keep amplifier 2 from clipping on low impedance loads which occur at frequencies somewhat above the resonance of speaker 3 and is consequentially useful in adjusting the character of the amplifier for a particular speaker load 3. This circuit also provides a second spectrum which amplifier 1 uses to broaden the spectral lines of the input spectrum.

Like the signal on capacitor 53, the ripple on capacitor 67 modulates the signal passing through amplifier 1. The modulation of the input spectra by the spectra of the signals on capacitors 53 or 67 produces sidebands which make the very slender spectral lines of an input signal fatter. The time constant of the capacitor 67 and its load should be longer than 100 milliseconds, preferably between 300 and 800 milliseconds for half wave, or half that for full wave.

The other section of the power control means, resistor 71, controls the signal level to the clipping circuit and the feedback circuit to amplifier 1. The idea here is that the maximum voltage driving these circuits should remain constant over the rotation of potentiometer 61 and 71. To better achieve this invariance, an additional resistance is required from the emitter of transistor 4 to a positive supply, preferably a regulated supply. This resistance and resistor 65 is adjusted so that the feedback waveform at the junction of resistors 71 and 81 is invariant or almost so.

Resistor 72 and capacitor 73 conducts feedback to "Presence" potentiometer 74 and capacitor 75 and then on to amplifier 1 through resistors 76 and 77. Note that this variable feedback attenuation is inversely proportional to the potentiometer rotation while the bias to transconductance amplifier is directly proportional to said rotation (if one includes an offset). Consequently, the amount of feedback produced at the output of amplifier 1 is independent of the power control means potentiometer. This is important in maintaining a constant transfer function from the input to the speaker load.

Capacitors 73 and 78 work in concert with capacitors 11 and 17 to determine the frequency response of the output circuit. Capacitors 17 and 78 simulate the input capacitance and any additional capacitance of the power tubes of a vacuum tube amplifier. Capacitors 11 and 73 simulates the frequency response of the power tube coupling capacitors.

The output impedance of amplifier 2 and surrounding circuitry components 21-26 and 31-32 interacts with the impedance of speaker 3 to form non-feedback frequency response. The feedback network 71-78 and 81-82 drives amplifier 1 which in turn passes the feedback to amplifier 2. This feedback broadens the frequency response, reduces the output impedance, and makes the output impedance proportionally more resistive so long as the feedback is available. The saturation of amplifier by excessively large signals, i.e. a voltage across the input terminals of amplifier 1 in excess of 50 millivolts, reduces the gain of amplifier 1 substantially, and reduces the feedback, thereby narrowing the frequency response and increasing the output impedance.

The output impedance with feedback is picked for tone qualities from 0.05 times nominal load impedance to 5 times load impedance. Many players prefer no feedback at all thereby leaving the output impedance solely a function of the circuitry surrounding amplifier 2. Using little or no feedback not only produces a higher output impedance, it does not reduce the non-linearity or the "fat" effects so much. The substantial feedback used in typical solid state amplifiers minimizes non-linear, "fat", and speaker interaction effects to the point of obscurity.

All of the bias currents for amplifier 1 flow through grounded-base transistor 4. This transistor provides a low-impedance input at approximately ground potential so that the various d.c. components from the bias altering sources are small.

The clipping circuit clips the drive signal according to the feedback signal. This signal from potentiometer 71 also drives the voltage divider resistors 81 and 82. The reduced feedback signal drives the emitter follower pair 83 and 84. These transistors, as well as transistors 85 and 86, are both NPN and PNP so that both positive and negative signals can be clipped. Resistor 87 and the emitter diode characteristics of transistors 83-86 produce the clipped character of amplifier 2. Capacitor 88 damps the clipping ringing.

The optional, but technically preferred, approach to resistor 87 is to make it also variable by adding another section to the ganged potentiometer and placing it in series with resistor 87. This combination would then keep the loop gain through the clipper constant and keep the clipping character constant.

The clipping circuit is a non-linear means responsive to said output which affects the output impedance.

The relationships within FIG. 1 remain the same or proportional as necessary. The change of bias by potentiometer 61 reduces the gain in the amplifier. The loop gain and the clipping level is maintained by potentiometer 71. Making resistor 87 variable and ganging it with potentiometer 61 and 71 keeps the clipping loop gain constant as well. Lowering the bias to the transconductance amplifier 1 and the consequential reduction in the output of amplifier 2 keeps all of the remaining signals proportional, ie. the signals through resistors 32 (current feedback), 33 (even harmonic creation without clipping), 43 (odd harmonic creation without clipping and non-constant gain simulation), 45 (compression), 52 (fat from the output), and 63 and 64 (ripple fat).

The poorly regulated power supply 66-67 for establishing the bias for the transconductance amplifier 1 has the same function as the bias supply in a push-pull vacuum tube amplifier. Not only does it generally set the proper operating point of the amplifier but it also supplies a fat creation signal that varies the gain of the amplifier and thereby generates intermodulation products and broadens the spectral lines of the input. These intermodulation products make the amplifier sound "fatter".

In fact, the nature of the fat is determined by the content of the signal. This is the reason that tube amplifiers sound different when run on 50 Hz power than when run on 60 Hz power. From this, it takes only a small step to create a bias supply of a direct current and any audio signal thereby creating fat of different consistencies. Further examination of this effect is that the fatness of the signal is dependant upon the frequency content of the input signal and the fat signal. The constant ripple produces fatter low frequency notes than high frequency notes.

An artistic solution to producing fatter high frequency notes is the microphone or other external input and amplifier 69 which produces a gain control signal. A second artistic solution incorporates a harmonically rich oscillator 69, such as a sawtooth oscillator, optionally controlled by an external input instead of an amplifier. Resistor 68 connects these gain control signal sources to transistor 4.

Notice that fat is different from the tremolo circuits. The point of the tremolo is to create a repetitive variation of the sound level in which each variation of sound level is perceptible. This can only be done at subsonic frequencies. Fat is creating sidebands to input frequencies Note too, that a fat source is not a compressor controller. The compressor controller uses non-linear means, such as diodes 39–40, to detect a signal level and does not produce sidebands.

This embodiment has virtually all of the elements of a tube amplifier: the output impedance of transformer impedance with plate resistance, the transfer function coupling from the driver tube to the output tubes, the non-linearity of the output tubes, the compression created by the power supply droop, the inclusion of "fat" from the power supply, bias shifting of the input, and driving the input from a non-linear network. The element that this circuit does not include is the bias shifting of the input to the power tubes. This eliminates the cross-over distortion and a type of compression. While the compression is good, the cross-over distortion produces harsh harmonics. This embodiment also has features not found in tube amplifiers: a means for turning it down and maintaining the tone by maintaining the inter-relationships within the amplifier and fat creation from the amplifier output and from external sources, such as voice or another instrument.

ANOTHER EMBODIMENT

The second embodiment of the variable power tube emulator output stage includes all of the elements in a "tweed" power amplifier circuit. It begins with a hard-working triode emulator 303 and continues with a cathodyne phase splitter 313. The phase splitter drives the pentode emulators similar to FIG. 11 of U.S. Pat. No. 5,434,536. This disclosure departs from the prior disclosure in that the non-linear transfer function networks 109 and 136 are connected to drive the output amplifier 2. The cancellation of bias currents here dissipates far less power than the cancellation of the bias currents in the output transistors of the prior disclosure. Like the prior disclosure the output of amplifier 2 is fed back to non-linear plate resistance networks 121 and 122. Because of the different phasing of this disclosure, the plate resistance networks operate directly on the current through the transfer function networks 109 and 136. This is made possible by using the parallel resistor and diode network design of FIG. 4 and bringing out its lone resistor 109a and 136a respectively leaving the balance of the network within the symbols marked 109b and 136b respectively.

The non-linear networks 121 and 122 alter the output impedance as a function of the output signal. Since the signals from these networks are combined with signals from the input, via amplifiers 108 and 208, the output impedance is also a function of the input signal.

The input to this circuit typically arrives via a coupling capacitor 301 and has an audio spectrum with spectral lines or frequency components. Resistor 302 establishes the bias on the grounded-cathode tube emulator 303. This tube emulator is like that of FIGS. 5 or 7 of U.S. Pat. No. 5,434,536, included herein by reference, or like the tube emulators in my paper, "The Tube Sound and Tube Emulators", *dB Magazine*, July/August 1994, also included herein by reference. The tube emulator includes a non-linear means depicted in FIGS. 3–5 and provides the same function as non-linear means 9 of FIG. 1. This emulator has plate load resistance 304 and cathode resistances 305–307. Resistor 306 is similar to the cathode resistance in a tube amplifier although proportionally smaller because the tube emulators operate at about the same current as tubes but at about one tenth the voltage. Resistor 307 provides the feedback from the output. Resistor 305 fixes the non-proportionality of the tube emulator biasing and is many kilohms.

The first stage is coupled to the cathodyne phase splitter 313 by capacitor 310. This phase splitter is biased by resistors 311 and 312 about midway between ground and the negative supply. Although most tube amplifiers use a self-biasing scheme, that technique has a problem when overdriven, the charge on the coupling capacitor 310 cannot be discharged rapidly. Conveniently, the cathodyne phase splitter, detailed in FIG. 6, cannot be self-biased and must be fixed biased as shown.

The output of this phase splitter drives the "plate" load resistance 102 and "cathode" load resistance 202. The output signals of the phase splitter 313 are coupled to the pentode emulators by capacitors 103 and 203. Diodes 104 and 204 and voltage reference 105 form the grid conduction simulation network similar to components 104 and 105 of FIG. 11 of U.S. Pat. No. 5,434,536. Resistors 106 and the combination of 206a and 206b represent the grid resistors for the output tubes.

Diodes 104 and 105 and the connecting capacitors and resistors form bias shifters which produce a form of compression and increase crossover distortion.

At this point, the grid circuit, aside from capacitance effects, is complete. The emulation then must continue from two out-of-phase signals with same polarity non-linear effects to two signals that are in phase with opposite polarity effects. These signals are then joined to drive amplifier 2.

Operational amplifier 108 is configured as an inverting amplifier driven by resistor 106 and summation resistor array 320 and has a feedback resistor 107. Operational amplifier 208 is configured as both a non-inverting and an inverting amplifier driven by the voltage divider 206 (non-inverting) and amplifier 321 (inverting) and has a feedback resistor 207. Amplifier 321 has feedback resistor 322. This operational amplifier is coupled to operational amplifier 208. Resistor 324 is necessary to set the gain properly. The gains of amplifiers 108 and 208 should be the same and should be sufficiently low that the simulated grid conduction keeps these amplifiers from clipping in that direction, negative for amplifier 108 and positive for amplifier 208.

The non-linear transconductance characteristic is created with non-linear networks 109 and 136. These networks are connected in the opposite polarity to their respective driving amplifiers 108 and 208 and are connected together to drive output amplifier 2. This topology allows the bias current to be canceled while it is still small instead of canceling it in the output stage where it is quite large and dissipates a great deal of heat requiring extensive heat sinking. Mathematically, amplifier 108 forms the sum of the signal and the bias, amplifiers 321 and 208 form the difference of the signal and the bias, the non-linear networks 109 and 136 forms the square of the sums and differences, and the difference of these squares produces a product of the signal and the bias. Since the bias is a D.C. component and various audio components, the result is the amplified signal and the amplified signal modulated by these various audio components.

The non-linear networks approximate the transconductance of the output tubes with a squaring characteristic.

Although transistors have non-linear characteristics and MOSFETs have approximately squaring characteristics, their thermal characteristics make them unusable. Putting in effective degenerative resistors to solve the thermal problems excessively linearizes the device gain.

Together, the non-linear networks 109 and 136 produce odd harmonics in the output without or prior to clipping.

The plate resistance characteristic is determined in part by the non-linear networks 121 and 122 which drive their respective phases through transistors 331 and 332 and diodes 333 and 334. This connection is made possible by using the series-parallel form of the non-linear networks which has a lone resistor in series. That lone resistor is 109a and 136a for the balance of the network 109b and 136b respectively. The networks 121 and 122 are preferably exponential, although not as aggressive as silicon diodes.

The plate resistance characteristic is driven by amplifier 335 which is driven by a feedback signal on wire 336. The gain of this amplifier and the nature of the feedback loop completes the determination of the plate resistance characteristic.

The non-linear networks 109 and 136 drive amplifier 2 through the potentiometer 340 which works in conjunction with resistor 341. Potentiometer 340 is then connected to the coupling capacitor 22 as well as current feedback resistor 32. The signal is coupled by 22 to amplifier 2 and its feedback loops 23 and 24–26. Amplifier 2 drives the global feedback potentiometer 345 and speaker 3 whose current is sensed by resistor 31.

The output impedance of amplifier 2 as seen by the speaker does not remain constant with either frequency or level. So long as the grid conduction emulation diodes are not conducting, the feedback will act to lower the output resistance and make it more resistive. The actual impedance, of course, depends upon the amount of feedback. When the diodes 104 and 204 are conducting, or when the feedback is not implemented, or when the standard feedback diminishing Presence control (not shown) is fully effective, the output impedance is determined by amplifier 2 and its immediately surrounding components. Resistors 340, 341, 32, and 31 and the gain-bandwidth product of amplifier 2 determine the capacitive nature of the output impedance at high frequencies. Resistors 31, 32, and 23 and non-linear elements 109, 121, 122, and 136 determine the resistive output impedance at middle frequencies. The inductive behavior of the output impedance at low frequencies is determined by resistors 340, 341, 32, 31, 24, and 25 and capacitors 22 and 26. Preferably, although hardly mandatory, the time constant of the input is the same as the feedback loop so that the contribution to the inductive character by capacitor 22 can transition smoothly to the contribution by capacitor 26. The effects of the capacitors are limited in frequency range by their accompanying resistors.

The global feedback from amplifier 2 to tube emulator 303 passes through variable resistor 345 and fixed resistor 307. Variable resistor 345 is ganged with resistor 340 (as well as a potentiometer in the variable gain amplifier 348). As these resistors are turned down the voltage from ground to the wiper of 340 becomes less for a constant signal level through networks 109 and 136. The resulting smaller signal out of amplifier 2 is compensated by decreasing the resistance of 345 making the signal at 336 constant. Since amplifier 335 is connected to 336, the plate resistance signal is also constant.

The remaining signal levels to hold constant is the signal path through 348, 131, and 132. The gain of amplifier 348 is increased by another section of a ganged pot which also contains variable resistors 340 and 345. The output signal level of 348 should also remain constant, independent of the rotation of the ganged potentiometer. Like FIG. 11 of U.S. Pat. No. 5,434,536 this signal is rectified by 131 and filter 132, preferably a low-pass filter. The output of this filter is connected to the summing resistors 320 via wire C to drive amplifiers 108 and 208.

A falling signal on wire C causes the output of amplifier 108 to rise and the output of amplifier 208 to fall. Consequently, the currents in the non-linear networks are reduced and their dynamic resistances go up reducing the gain of the whole amplifier. Line C is then a control signal to a variable gain amplifier.

Line B comes from a fat signal source such as a bias supply which is a simple diode or full-wave rectifier and capacitor like the unregulated supply 66–67 of FIG. 1.

One alternative fat signal source is at least a low pass filter and may include a compressor. An example of this arrangement is components 51–55 of FIG. 1. Other and additional sources are the power supply for screen grid induced fat and any audio signal, preferably passed through a low-pass filter.

The gain control signal summation block 320 can also be configured to receive signals from a second input by way of an amplifier or an oscillator by simply adding more summation resistors. The sum of the gain control signals has a spectrum which is used by non-linear networks 109 and 136 to broaden the spectral lines of the input spectrum.

Figure 2:
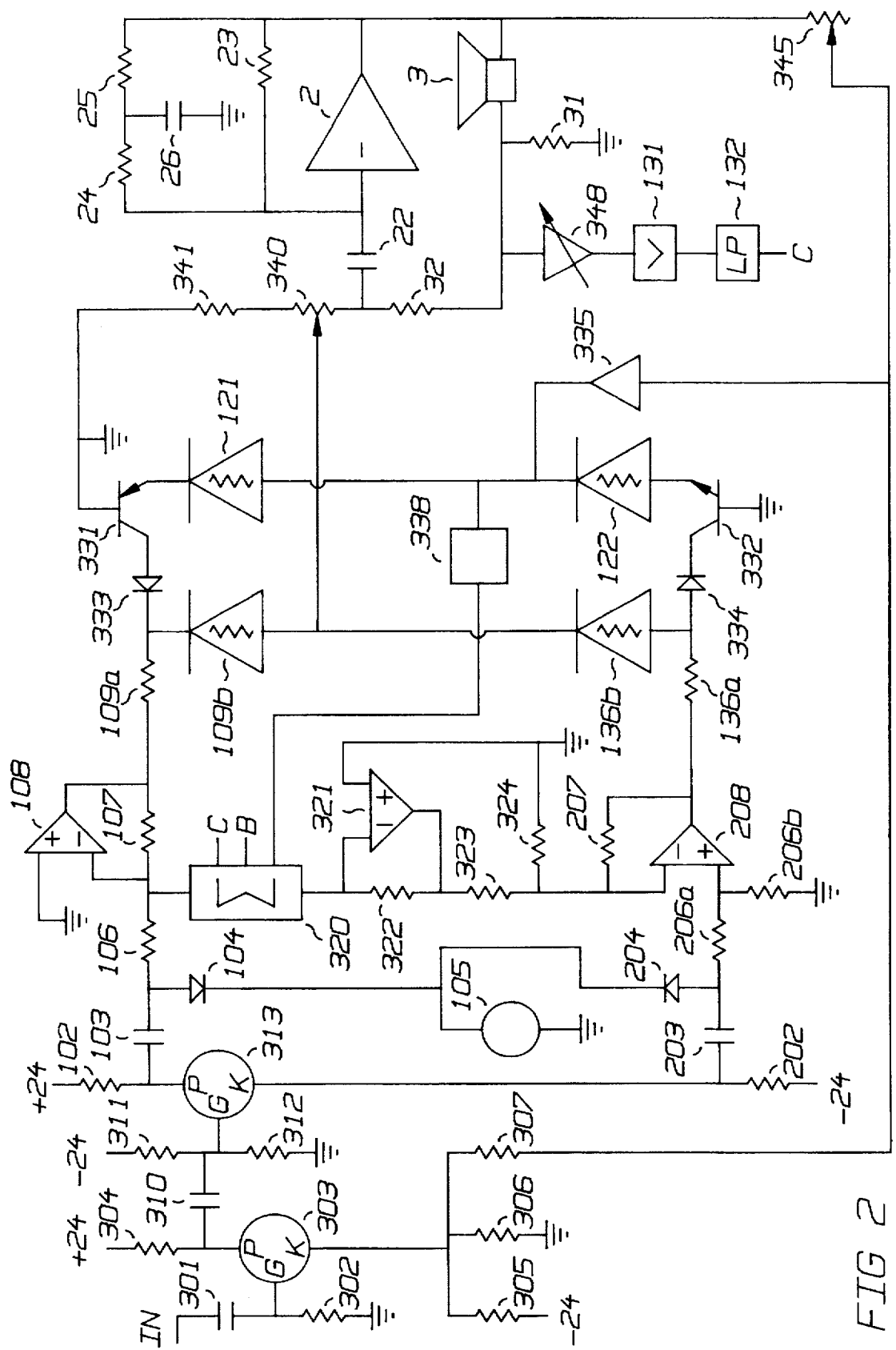
FIG. 2 is a schematic of a variable power amplifier using non-linear networks.

FIG. 2 is a second embodiment similar to FIG. 11 of U.S. Pat. No. 5,434,536 but includes the phase splitter, global feedback, fat creation, compression, and the variable power attenuators and gain controls. As can be readily seen, this concept is more complex because it requires more attenuators and gain controls to keep all of the relationships right:

(1) A smaller output requires less feedback attenuation to keep the preamplifier working the same way.

(2) A smaller output requires less output drive, and requires attenuation in both drive signals.

(3) A smaller output requires a gain increase in the feedback generated by the output current or the emulation thereof.

(4) A smaller output requires a gain increase in the fat feedback.

(5) A smaller output requires a gain increase in the feedback for plate resistance.

Thus, about six coordinated changes must take place to keep the relationships intact, although it seems that (1), (4) and (5) might be combined to reduce it to three or four depending upon the implementation of (2).

THE NON-LINEAR MEANS

Figure 3:
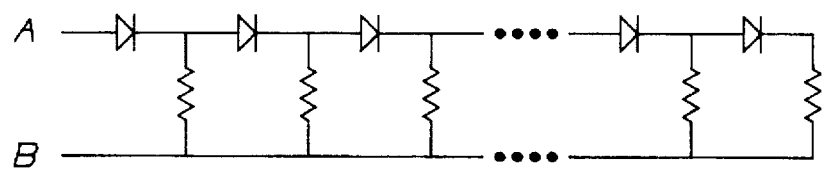
FIG. 3 is the schematic of a parallel resistor-diode network.
Figure 4:
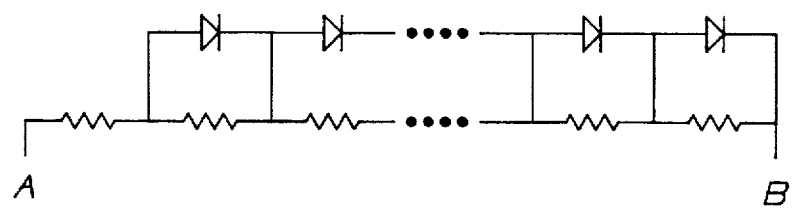
FIG. 4 is the schematic of a series resistor-diode network.
Figure 5:
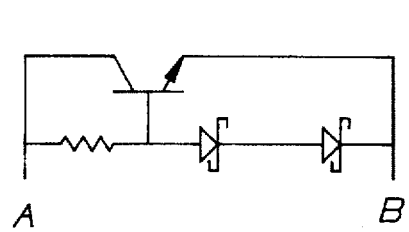
FIG. 5 is the schematic of a diode-transistor network.

The non-linear means are depicted in FIGS. 3–5 and described in several prior applications, included herein by reference. FIG. 3 shows series diodes with a ladder of resistors. As the voltage from terminal A rises above terminal B, more and more resistors are brought into the circuit by conducting diodes, thereby causing the resistance to drop as a function of said voltage and the current flow from terminal A to terminal B to rise non-linearly with respect to said rising voltage from A to B.

FIG. 4 shows a series string of diodes wherein each diode has a parallel resistor. Again, a rising voltage from terminal A to terminal B causes more and more diodes to conduct, thereby effectively removing resistors from the circuit and causing the resistance to drop as a function of said voltage and the current flow from terminal A to terminal B to rise non-linearly with respect to said rising voltage from A to B.

It is quite advantageous to create a current proportional to the square of the voltage from A to B. In FIG. 3, this is done by making the resistors equal. In FIG. 4, this is done by making the resistors proportional to the following series: 1/2, 1/6, 1/12, 1/20, 1/30, . . ., 1/n(n+1), . . . The resistor without the parallel diode is 1/(n+1) if there are n diodes in the network.

FIG. 5 shows a diode-transistor resistor technique for creating non-linearity. A voltage from A to B creates a current in the resistor and the series diodes. The voltage across the diodes is proportional to twice the logarithm of the current through the diodes. The current in the transistor is proportional to the exponential of the diode voltage, hence the transistor current is approximately proportional to the square of the voltage from terminal A to terminal B.

An extra input to the diode-transistor network of FIG. 5 can be created simply by injecting current into or removing current from the base of the transistor. In view of the diode conduction, this current offsets the voltage across the network.

THE CATHODYNE PHASE SPLITTER

Figure 6:
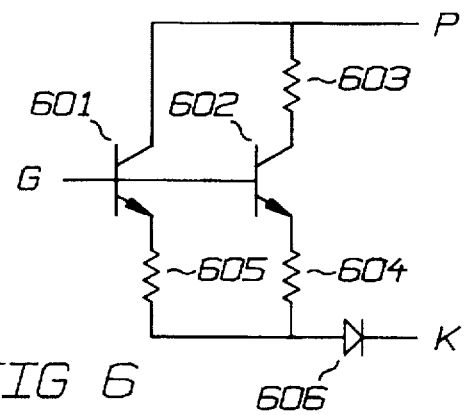
FIG. 6 is a schematic of a cathodyne phase splitter.

FIG. 6 is a cathodyne phase splitter which uses two transistors 601 and 602. The bases of both transistors are connected to the "grid" terminal G. Transistor 602 has a resistor 603 between its collector and the "plate" terminal P while the collector of transistor 601 is connected directly to terminal P. Resistors 604 and 605 connect the emitters of the transistors 602 and 601 respectively to diode 606 which connects this emulator to the "cathode" terminal K and keeps reverse currents from flowing. Resistors 604 and 605 divide the total current between the two transistors according to their values. Since transistor 602 emulates grid conduction by saturating, transistor 601 must emulate the current gain of a tube in grid conduction. If this current gain is 2, then twice as much current must flow through 605 as flows through 604 for essentially the same voltage. Hence for a current gain of 2 the resistance of 605 is one-half of the resistance of 604. The plate resistance that is critical in this case occurs at the grid conduction. At grid conduction the emulated tube has some plate resistance, about 50,000 ohms for the ubiquitous 12AX7. Given that the emulation is preferably at one-tenth the impedance and the current division is ⅔:⅓ the preferred value for 603 is then 15,000 ohms.

THE TRANSFER FUNCTION

The high-frequency open loop transfer function of FIG. 1 is determined by the time constant involving capacitor 17 and the gain-bandwidth product of amplifier 2 as reduced by resistor 21. The global feedback loop which includes capacitor 78 broadens the open loop transfer function frequency response. Preferably it does so by making the feedback response approximately critically damped. This provides a nearly flat response with a substantial lagging phase shift. Similarly, the low-frequency open loop transfer function of FIG. 1 is determined by the time constants involving capacitors 11, 22, and 26. The global feedback loop which includes capacitor 73 broadens the open loop transfer function frequency response. Again, it does so by making the feedback response approximately critically damped for a nearly flat response with a substantial leading phase shift. This makes the higher frequencies appear to come after the low frequencies.

The high frequency character of FIG. 2 is determined by the high frequency character of the tube emulator 303, any roll-off that can be applied to the feedback of amplifiers 108 and 208 (ie. capacitors in parallel with resistors 107 and 207), and the gain-bandwidth of amplifier 2 as modified by resistors 340 and 341. The low frequency character of FIG. 2 is determined by the time constants involving capacitors 301, 103, 203, and 22.

Large input signals overdrive amplifier 1 of FIG. 1 and cause the grid conduction emulation diodes 104 and 204 of FIG. 2 to conduct. When this happens the frequency response at the output and the output impedance is reduced to the dependency only on the components after said amplifier or said diodes. Feedback is no longer available to make the frequency response broader or the output impedance less reactive and smaller. Consequently, the character of the amplifier changes upon overdrive, the frequency response changes and becomes reduced.

These transfer functions are approximately independent of the ganged power control and feedback control wiper positions.

MAINTENANCE OF THE TRANSFER FUNCTION

The concept of the power control or "watts" knob is to vary the maximum output level without altering the tone or character of the amplifier. This is done by making every aspect of the amplifier independent or practically independent of the power control.

The global feedback or loop gain is unchanged. In FIG. 1, a reduction of the transconductance of amplifier 1 by potentiometer 61 is countered by an increase in the feedback by a reduction in the feedback attenuation by variable resistor 71. Resistor 71 also keeps the clipping level of network 83–88 constant with respect to the input. The consequential reduction of the sensed current fits with reduced bias current flowing in resistors 63 and 64. The consequential reduction of the fat currents from the ripple in the bias supply is also proportional. However, with the level sensing compressor, the other fat introducing device, the current 52 is not so proportional. In the interest of cost, this may be acceptable. Similarly, the clipping network 83–88 resistance may remain constant, although resistor 87 would like to be increased to offset the decrease in 71 so that loop would also be independent of potentiometer rotation.

Similarly in FIG. 2, the reduction of input stage signal by potentiometer 340 is countered by an increase in feedback by variable resistor 345. This variable resistor also keeps the fat feedback and the plate resistance signals constant. The signal path through 131 and 132 is kept invariant by adjusting the gain of amplifier 348 upward for a reduction in drive by potentiometer 340 and the countering change in variable resistor 71.

THE DIGITAL EMULATOR AND THE VARIABLE-POWER OUTPUT STAGE

Figure 7:
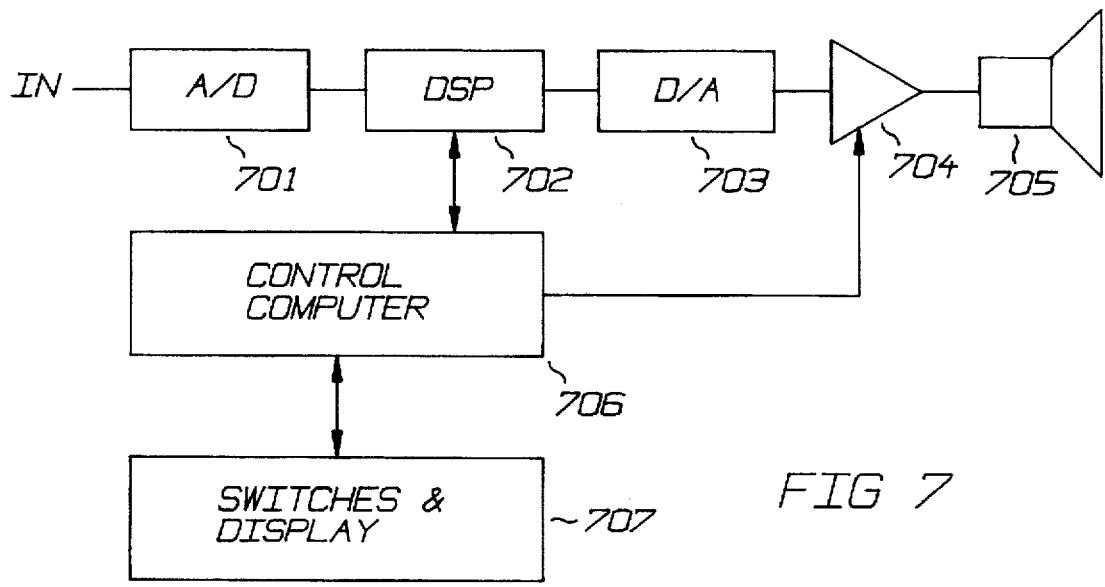
FIG. 7 is a block diagram of a typical digital system for audio.

FIG. 7 depicts a generalized digital system that is a versatile guitar amplifier. This system consists of an analog-to-digital converter 201 for receiving the input; a digital signal processor 202 for emulating the preamplifier section of the guitar amplifier and for performing sound effects such as reverb, chorus, delay, flanging, pitch shifting, etc.; a digital-to-analog converter 203 for driving amplifier 204 and thence speaker 205 with the calculated values; and a control computer 206 for controlling said signal processor and said amplifier in response to information conveyed by input switches 207 and for providing display information for 207 to display. As my earlier patent, U.S. Pat. No. 4,995,014, states computer 206 may also control other peripheral devices such as a guitar input multiplexer.

The actual control of amplifier 204 by computer 206 may take several forms. First, the computer might operate a motorized gang of potentiometers to adjust the power or "watts" of the amplifiers depicted in FIGS. 1 or 2. Second, the potentiometer might be replaced by a multi-tap voltage divider and a multiplexer and the computer simply selects which tap along the voltage divider would be used. A third possibility is to use a lamp and multiple light dependant resistors, one of which in a feedback loop akin to the motorized potentiometer. The art is replete with control techniques.

The reason the marriage of the present amplifiers with digital emulation is so important is found in the operational behavior of the digital signal processor. First, the digital signal processor will be stretched to its maximum computational capability without having to emulate the output stage too. Second, the emulation of the output stage with its usual feedback loop is an iterative process unless a non-feedback emulation is suitable. Third, the emulation of the output stage should include the speaker current which demands an iterative solution. Fourth, it is advantageous to vary the power capability of the system with the changes in amplifier emulation so that there can be a screaming guitar in the background in one case and a loud clean guitar in the foreground in another case. This can not be done with the standard amplifier without the sacrifice in tone now found.

VARIABLE RIPPLE BIAS SUPPLY

FIG. 8 shows an alternative bias supply designed to increase ripple with signal level and thereby make the broadened spectral lines more noticeable. The secondary of a power supply transformer provides A.C. voltage to full-wave rectifier diodes 802 and 803. The rectified power is filtered by resistor 804 and capacitor 805. In addition to the load presented by bias circuitry, a variable load is presented by resistors 806 and 807 and transistors 808 and 809 in response to a signal on resistor 807. The transistors are connected with the emitter of one to the base of the other so that one forward biased junction protects the other device's reverse biased junction. The resistor values are equal.

When the signal is positive, then transistor 809 conducts with the base current in resistor 807 and the emitter current in resistor 806. When the signal is negative, then transistor 808 conducts with base current in 806 and the emitter current in resistor 807. By making the resistor values equal, the transconductance of this circuit is equal for positive and negative input voltages.

The best signal for the emulation of vintage amplifiers is the signal on the current sense resistor such as 31 of FIGS. 1 or 2. However, the levels of this signal change with the variable power control. The output of amplifier 348 of FIG. 2 is compensated not to vary with the power control. However, the psychoacoustics is served better and the tube concept can be extended if resistor 807 is connected to an earlier invariant point such as the input to FIG. 1, or the output of amplifier 108, or the output of an internal amplifier in the tube emulator 303.

LOUDSPEAKER AS VARIABLE GAIN DEVICE

Figure 9:
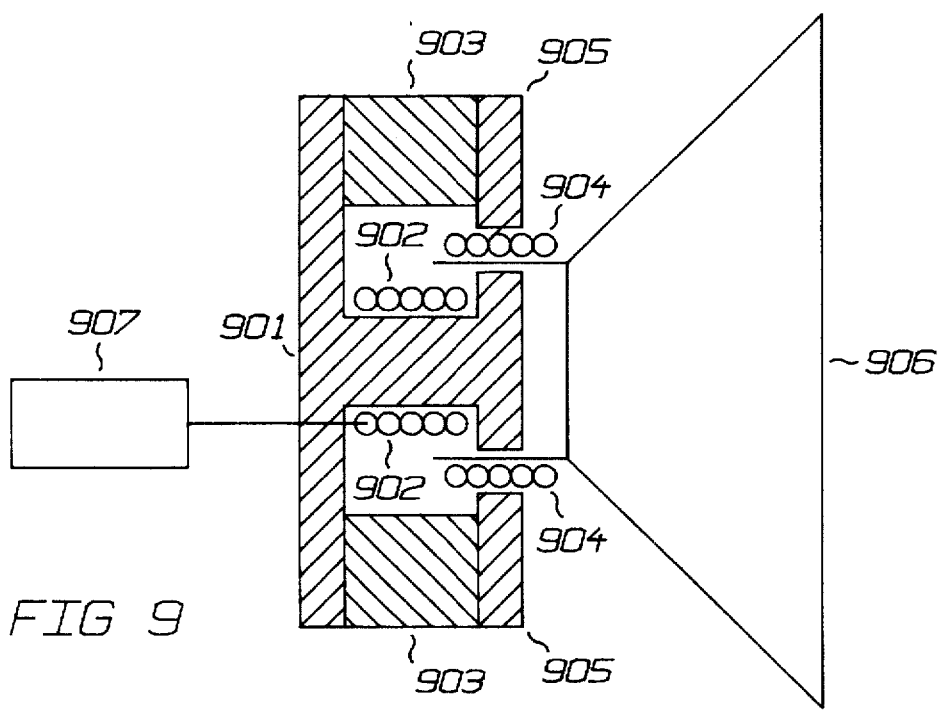
FIG. 9 is a diagram of an electro-magnetic loudspeaker.

FIG. 9 shows a section view of another variable gain device, a loudspeaker. The pole piece 901 has a field coil 902 which varies the magnetic field of the permanent magnet 903. The varying magnetic field passes through the voice coil 904 and returned by the pole piece 905 directly to the magnet 903 and via air and magnet to coil 902. The speaker input current, having an audio spectrum with spectral lines, flows in the voice coil 904 and in reaction with the magnetic field drives the speaker cone 906 which produces the output sound pressure waves. For clarity the speaker structure is not shown. The field coil 902 is driven by a frequency-rich source or fat generator 907 which has a spectrum that is used by the multiplicative behavior of the voice coil current and the field magnetic field to produce modulation products which result in the input spectral lines or frequency components being broadened by the field spectra.

The force that moves the voice coil 904 is proportional to the product of the current in the voice coil 904 and the magnetic field that crosses through it. This is mathematically equivalent to a variable gain amplifier. The voice coil signal is equivalent to the signal input of the inverting input of amplifier 1 of FIG. 1 while the magnetic field is equivalent to the current flowing in transistor 4. The voice coil motion and sound is equivalent to the output of amplifier 1. The permanent magnet field is equivalent to a constant bias current while the voice coil signal as supplied by source 907 is equivalent to the fat generation signal on resistor 52 as disclosed in a prior application or any frequency-rich signal such as power supply ripple, the output of a sawtooth waveform generator, the output of an arbitrary waveform driver.

As shown in FIG. 8, source 907 may vary its output intensity in response to the signal level.

FIG. 9 may be generalized by realizing that the magnet 903 may be simply replaced by a ferrous material to conduct the magnetic field from pole piece 901 to pole piece 905 and by realizing that the coil 902 can supply the entire magnetic field if the source 907 has a direct current component and is otherwise harmonically rich.

Furthermore, the source 907 can also be variable so that the voice coil 904 is in a variable field because lowering the magnetic field will lower the sound intensity produced by the cone 906.

THE "FAT" GUITAR PICKUP

Figure 10:
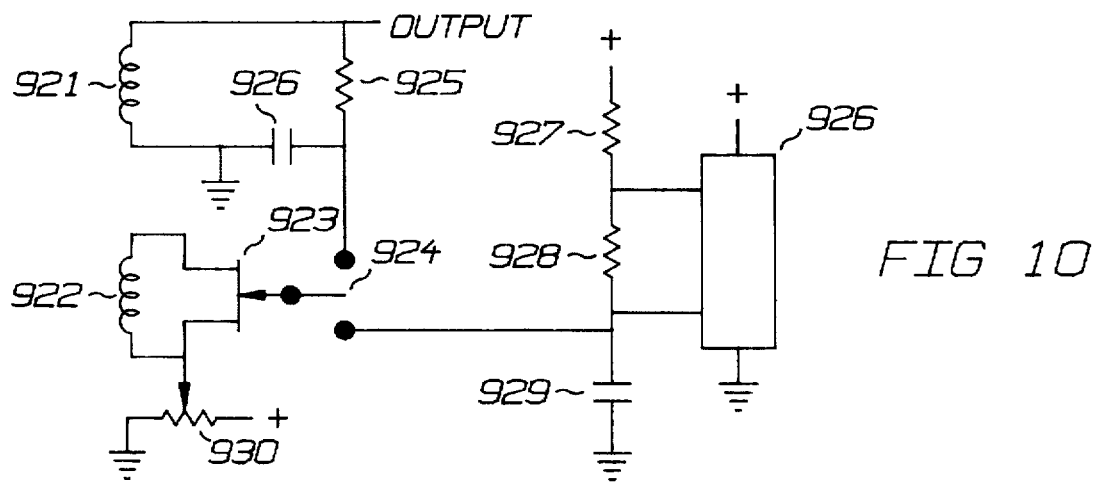
FIG. 10 is a diagram of a "fat" guitar pickup.

FIG. 10 illustrates a "fat" guitar pickup composed of two windings which are wound on the same pole pieces and have mutual coupling. Winding 921 provides the output from the input magnetic field which has an audio spectrum with spectral lines. Winding 922 has about one tenth the number of turns as 921 so that its voltage does not exceed the linear resistance range of the field effect transistor 923. Switch 924 selects the two possible "fat" sources. The first source is created from winding 921 with the low-pass filter made of resistor 925 and capacitor 926. The time constant of this filter is between 10 and 0.1 milliseconds. This reduced input spectrum is used by field effect transistor 923 to produce a load on winding 922 which attenuates the output of winding 921. The constantly varying attenuation produces modulation products of the two spectra that produces even harmonics at low frequencies while broadening the spectral lines of the high frequencies.

The second source is a harmonically rich sawtooth wave created by an oscillator. Integrated circuit 925 is a CMOS 555 low current timer chip. Resistors 927 and 928 charge capacitor 929 until the capacitor voltages reaches a high threshold and the integrated circuit discharges it via resistor 928. The cycle repeats when the capacitor voltage reaches a lower threshold.

The selected "fat" signal operates the gate of the field effect transistor 923. This changes the effective resistance from source to drain of this transistor. The bias on the transistor is adjusted by potentiometer 930. This adjusts the depth or level of the "fat" effect> It adjusts the attenuation of the circuit, or in general it adjusts the fractional gain of the circuit.

The resistive loading of the field effect transistor has a dampening effect on the pickup. An alternative to the field effect transistor is the tuning diode whose junction capacitance changes with voltage. The changing capacitance changes the attenuation at various frequencies thereby creating a broadening of the spectral lines. Both the field effect transistor and the tuning diodes are means whose impedance varies with their inputs.

Although the present invention has been described and illustrated in detail, it is to be clearly understood that the same is by way of illustration and example only, and is not to be taken by way of limitation. The spirit and scope of the present invention are to be limited only by terms of the appended claims.

I claim:

1. An audio amplifier
having a first input for receiving an input signal having a first audio spectrum having at least one audio frequency,
having an output for producing an output signal,
having feedback with a loop gain and a feedback signal, and
having a gain between said input and output comprising:
input means for receiving said first input and said feedback signal and for producing an intermeans signal;
power control means for controlling the maximum level of said intermeans signal and the gain of the amplifier;
output means responsive to said intermeans signal for producing said output and said feedback signal; and
feedback control means operating in conjunction with said power control means for keeping said loop gain constant.

2. The amplifier of claim 1 including clipping means for clipping said output wherein the clipping level of said clipping means remains constant with respect to said first input.

3. The amplifier of claim 1 wherein said input means includes a variable gain amplifier having a gain responsive to a gain control signal having a second audio spectrum and wherein said output has a spectrum which has said audio frequency plus sidebands created by said second audio spectrum.

4. The amplifier of claim 3 wherein said gain control signal is responsive to an amplifier signal.

5. The amplifier of claim 3 including a power supply having ripple and wherein said gain control signal is responsive to said power supply.

6. The amplifier of claim 5 including load means responsive to an amplifier signal for loading said power supply having ripple to increase said ripple as a function of said amplifier signal.

7. The amplifier of claim 1 wherein said input means is responsive to a computed signal and includes a digital means comprising:
analog-to-digital conversion means for receiving said first input and producing a first digital output;
computer means having programs for calculations upon said first digital output for producing a second digital output and for controlling said power control means and said feedback control means; and
digital-to-analog conversion means for receiving said second digital output for producing said computed signal.

8. The amplifier of claim 7 wherein said computer controls said power control and said feedback control with a servo controlled potentiometer means.

9. The amplifier of claim 7 wherein said computer controls said power control and said feedback control with light dependant resistor means.

10. The amplifier of claim 7 wherein said computer controls said power control and said feedback control with multiplexer means.

11. The amplifier of claim 1 wherein said input means includes non-linear means for producing harmonics without clipping and for emulating the cutoff of triode vacuum tubes.

12. The amplifier of claim 1 wherein said input means includes low-pass filter means for filtering said input means.

13. The amplifier of claim 1 wherein said input means includes bias shifting means for altering the bias of a signal in said input means in response to the amplitude of said signal.

14. The amplifier of claim 1 wherein said input means includes compression means.

15. The amplifier of claim 1 wherein said output has a frequency response which is reduced upon the overdrive of the input means by large signals on said input.

16. The amplifier of claim 1 wherein said output means has an output impedance which is inductive at low audio frequencies;

resistive at middle audio frequencies; and capacitive at high audio frequencies.

17. The amplifier of claim 1 which includes digital computer control means to control said power control and feedback control means.

18. An audio amplifier having no thermionic emission devices, having a first input, having an output and an output signal, having an audio input-to-output frequency response characteristic, and having an output impedance comprising:
an input means for receiving said first input and a feedback signal, for producing an intermeans signal, and for disabling said feedback signal when a signal on said input overdrives said input means;
an output means responsive to said intenneans signal for producing said output signal and said feedback signal;
said output means having an output impedance dependant upon the feedback signal when the feedback signal is disabled the output impedance is capacitive at high frequencies, resistive at middle frequencies, and inductive at low frequencies and when the feedback is present the output impedance is reduced and proportionally more resistive.

19. The amplifier of claim 18 wherein said input means includes non-linear means for altering said output impedance as a function of the signal on said output.

20. The amplifier of claim 18 wherein said input means includes non-linear means for altering said output impedance as a function of the signal on said input.

21. The amplifier of claim 18 wherein said input means includes a variable gain amplifier means which is responsive to one or more gain control signals.

22. The amplifier of claim 21 wherein said input means includes ripple means for creating power supply ripple and for producing a gain control signal.

23. The amplifier of claim 18 wherein said input means includes bias shifting means for altering the bias of an input means signal as a function of said signal.

24. The amplifier of claim 18 wherein said input-to-output frequency response narrows upon the disabling of the feedback by excessive signals.

25. The amplifier of claim 18 wherein said input means is responsive to a computed signal and includes:
   analog-to-digital conversion means for receiving said input and producing a first digital output;
   computer means having programs for calculations upon said first digital output for producing a second digital output; and
   digital-to-analog conversion means for receiving said second digital output for producing said computed signal.

26. An audio amplifier having an input having a first audio spectrum having at least one audio frequency component and an audio output having an output impedance comprising:
   input amplifier means responsive to said input;
   first control means for controlling the output of said input amplifier;
   output amplifier responsive to said input amplifier and responsive to a clipping signal;
   clipping means responsive to said output amplifier for producing said clipping signal wherein the clipping level of said clipping means is controlled by a second control means; wherein
   said output impedance is inductive for low audio frequencies, resistive for middle audio frequencies, and capacitive for high audio frequencies.

27. The amplifier of claim 26 wherein said input amplifier is also responsive to feedback and said feedback is controlled by a control means.

28. The amplifier of claim 26 wherein said first and second control means operate simultaneously.

29. The amplifier of claim 26 which includes computer means for controlling said first and second control means.

30. The amplifier of claim 26 which includes:
   analog-to-digital conversion means responsive to said input for producing digital representations of the input;
   computer means responsive to said analog-to-digital conversion means for creating sound effects and for producing digital representations therefore;
   digital-to-analog conversion means responsive to said computer means for driving said input amplifier.

31. The amplifier of claim 26 wherein said output amplifier includes:
   current feedback means for sensing the current in said output and producing a current feedback signal;
   connection means for combining current feedback signals and input amplifier signals;
   capacitive coupling means for coupling said input and current feedback signals to an output amplifier;
   voltage feedback means responsive to said output for producing voltage feedback signals; and
   output amplifier means responsive to said coupled input and current feedback signals and responsive to voltage feedback signals for producing said output.

32. The amplifier of claim 31 wherein said voltage feedback means includes low-pass filter means.

33. The amplifier of claim 31 wherein said connection means includes a shunt resistor connected to ground.

34. The amplifier of claim 31 wherein said input means includes a variable gain amplifier responsive to said input and responsive to gain control signals.

35. The amplifier of claim 31 wherein said input means includes amplifier means responsive to said input for providing gain and non-linear means connected to the output of said amplifier means for providing the cutoff characteristic of triode vacuum tubes.

36. The amplifier of claim 26 wherein said input amplifier includes a transconductance amplifier with a gain control input responsive to said one or more control means.

37. The amplifier of claim 36 which includes a power supply having ripple to produce a gain control signal.

38. The amplifier of claim 36 which includes a first filter means responsive to said output for producing a gain control signal.

39. The amplifier of claim 36 which includes a rectification means responsive to said output for the production of a gain control signal.

40. The amplifier of claim 39 which includes a second filter means responsive to said rectification means for the production of a gain control signal.

41. The amplifier of claim 36 which includes an oscillator means for the production of a gain control signal.

42. The amplifier of claim 26 wherein said input means includes a first non-linear means for producing harmonics without clipping and for emulating the cutoff of triode vacuum tubes.

43. The amplifier of claim 42 wherein said input means includes solid state means for emulating a cathodyne phase splitter.

44. The amplifier of claim 42 wherein said input means includes:
   a phase splitter having first and second phase splitter outputs;
   first and second coupling capacitors for coupling said first and second phase splitter outputs to first and second diode means and to second and third non-linear means; wherein
   said second and third non-linear means drive said output amplifier.

45. The amplifier of claim 26 wherein said clipping level control is a variable attenuator responsive to said output and wherein said clipping means includes an emitter follower transistor which drives a grounded base transistor.

46. An audio amplifier having an input with a first spectrum with at least one frequency component and having an output with an output impedance comprising:
   an amplifier responsive to said input, for providing said output, having one or more gain control means, and having clipping means with clipping level control means; and
   control means independent of said output for conjunctively controlling the gain of said amplifier and the clipping level of said amplifier so that the clipping level relative to the level of said input is approximately constant.

47. The audio amplifier of claim 46 wherein said amplifier is also responsive to a feedback signal derived from said output thereby establishing a feedback loop with a loop gain and said control means maintains said loop gain and said output impedance approximately constant.

48. The audio amplifier of claim 46 wherein said gain and clipping level control means includes computer means.

49. The audio amplifier of claim 46 wherein said amplifier is responsive to a computed signal and said audio amplifier includes:
   analog-to-digital conversion means for receiving said input and producing a first digital output;

computer means having programs for calculations upon said first digital output for producing a second digital output; and digital-to-analog conversion means for receiving said second digital output for producing said computed signal; wherein said computer means also operates said control means.

50. The audio amplifier of claim 46 wherein said amplifier includes a source of a second audio spectrum and the gain of said amplifier is responsive to said source to produce intermodulation products of said first and second audio spectra and wherein said second spectrum gives said frequency component sidebands.

51. The audio amplifier of claim 46 wherein said amplifier has an output impedance which is inductive at low audio frequencies;

resistive at middle audio frequencies; and capacitive at high audio frequencies.

52. The audio amplifier of claim 46 wvhich includes an input amplifier for receiving said input and driving said amplifier, said input amplifier including an operational amplifier means for providing gain and a non-linear means for emulating the plate characteristics of a vacuum tube.

53. The audio amplifier of claim 46 wherein said amplifier includes:

solid state amplifier means for receiving said input and for providing gain;

a non-linear means connected to the output of said solid state amplifier means for emulating the plate characteristics of a vacuum tube; and transistor means connected to said first non-linear means for emulating a cathodyne phase splitter.

54. An audio amplifier having an input with a first spectrum with at least one frequency component and having an output with an output impedance comprising:

an amplifier responsive to said input and a clipping signal for providing said output;

clipping means including an emitter follower transistor responsive to said output and a grounded base transistor for producing said clipping signal; and clipping level control means for adjusting the clipping level of said amplifier output.

55. The audio amplifier of claim 54 wherein said clipping level control means is a variable attenuation means connected between said output and said clipping means.

56. The audio amplifier of claim 54 wherein said amplifier includes one or more gain control means and control means for controlling the gain of said amplifier and the clipping level of said amplifier so that the clipping level relative to the level of said input is approximately constant.

57. The audio amplifier of claim 54 wherein said amplifier is also responsive to a feedback signal derived from said output thereby establishing a feedback loop with a loop gain and said control means maintains said loop gain and said output impedance approximately constant.

58. The audio amplifier of claim 54 wherein said amplifier includes a source of a second audio spectrum and the gain of said amplifier is responsive to said source to produce intermodulation products of said first and second audio spectra and wherein said second spectrum produces sidebands to said frequency component.

59. The audio amplifier of claim 54 wherein said amplifier has an output impedance which is inductive at low audio frequencies;

resistive at middle audio frequencies; and capacitive at high audio frequencies.

60. The amplifier of claim 54 wherein said amplifier is responsive to a computed signal and said audio amplifier includes:

analog-to-digital conversion means for receiving said input and producing a first digital output;

computer means having programs for calculations upon said first digital output for producing a second digital output; and digital-to-analog conversion means for receiving said second digital output for producing said computed signal; wherein said computer means also operates said control means.

61. A solid state audio amplifier having an input and an output with an output signal comprising:

input means for receiving said input and producing an input signal;

current feedback means for sensing the current in said output and producing a current feedback signal;

connection means including capacitive coupling means for connecting said input and said current feedback signals to produce a capacitively coupled combined signal;

voltage feedback means responsive to said output for producing voltage feedback signals; and output amplifier means responsive to said coupled combined signal and responsive to voltage feedback signals for producing said output;

wherein said output has an output impedance which is inductive at low audio frequencies and resistive at medium audio frequencies.

62. The amplifier of claim 61 wherein said voltage feedback means includes low-pass filter means.

63. The amplifier of claim 61 wherein said input means includes a variable gain amplifier responsive to said input and responsive to gain control signals.

64. The amplifier of claim 61 wherein said input means includes amplifier means responsive to said input for providing gain and non-linear means connected to the output of said amplifier means for providing the cutoff characteristic of triode vacuum tubes.

65. The amplifier of claim 61 wherein said input means includes:

amplifier means responsive to said input for providing gain;

non-linear means connected to the output of said amplifier means for providing the cutoff characteristics of triode vacuum tubes; and transistor means connected to said non-linear means for emulating a cathodyne phase splitter.

66. The amplifier of claim 61 wherein said output amplifier has an output impedance which is inductive at low audio frequencies;

resistive at middle audio frequencies; and capacitive at high audio frequencies.

\* \* \* \* \*